United States Patent
Aota

(10) Patent No.: US 7,592,861 B2
(45) Date of Patent: *Sep. 22, 2009

(54) REFERENCE VOLTAGE GENERATION CIRCUIT, AND CONSTANT VOLTAGE CIRCUIT USING THE REFERENCE VOLTAGE GENERATION CIRCUIT

(75) Inventor: Hideyuki Aota, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 249 days.

This patent is subject to a terminal disclaimer.

(21) Appl. No.: 11/511,006

(22) Filed: Aug. 28, 2006

(65) Prior Publication Data

US 2007/0057291 A1    Mar. 15, 2007

(30) Foreign Application Priority Data

Aug. 31, 2005    (JP) .............................. 2005-252001

(51) Int. Cl.
*G05F 3/24* (2006.01)
(52) U.S. Cl. .................. 327/541; 323/313; 327/543
(58) Field of Classification Search ................ 327/541, 327/543, 539, 538; 323/313, 314
See application file for complete search history.

(56) References Cited

U.S. PATENT DOCUMENTS 6,005,378 A * 12/1999 D'Angelo et al. ........... 323/313
6,437,550 B2 * 8/2002 Andoh et al. ............... 323/315
6,628,161 B2 * 9/2003 Ikeda ......................... 327/538
2003/0214336 A1 * 11/2003 Watanabe ................... 327/200
2005/0077885 A1 * 4/2005 Aota .......................... 323/315

FOREIGN PATENT DOCUMENTS

| JP | 54-132753 | 10/1979 |
| JP | 4-65546 | 10/1992 |
| JP | 2001-284464 | 10/2001 |

* cited by examiner

*Primary Examiner*—Akm E Ullah
*Assistant Examiner*—Harry Behm
(74) *Attorney, Agent, or Firm*—Cooper & Dunham, LLP

(57) ABSTRACT

A reference voltage generation circuit includes: a first field-effect transistor that is an n channel-type field-effect transistor of a depletion-type, wherein one terminal of the first field-effect transistor is connected to a predetermined power source voltage; a second field-effect transistor including a concentrated n-type gate, wherein one terminal of the second field-effect transistor is connected to another terminal of the first field-effect transistor; and a third field-effect transistor including a concentrated p-type gate, wherein one terminal of the third field-effect transistor is connected to another terminal of the second field-effect transistor; wherein a gate of the first field-effect transistor is connected to a part where the first and the second field-effect transistors are connected, each substrate gate of the first and the third field-effect transistors is connected to a ground voltage, a gate and a substrate gate of the second field-effect transistor and a gate of the third field-effect transistor are connected to a connecting part where the second and the third field-effect transistors are connected, and a reference voltage is output from the connecting part.

13 Claims, 9 Drawing Sheets

REFERENCE VOLTAGE GENERATION CIRCUIT, AND CONSTANT VOLTAGE CIRCUIT USING THE REFERENCE VOLTAGE GENERATION CIRCUIT

BACKGROUND

1. Technical Field

This disclosure relates to a reference voltage generation circuit and a constant voltage circuit using the reference voltage generation circuit. More particularly, this disclosure relates to a reference voltage generation circuit using a principle of a work function difference between gate electrodes of two field-effect transistors, and to a constant voltage circuit using the reference voltage generation circuit.

2. Description of the Related Art

FIG. 1 shows a conventional reference voltage generation circuit (refer to Japanese publication of examined application No. 4-65546, for example). In the reference voltage generation circuit, a depletion-type field-effect transistor and an enhancement-type field-effect transistor are serially connected, and a difference between threshold voltages (Vth) of these field-effect transistors is extracted as a reference voltage Vref.

In FIG. 1, a transistor 105 is a depletion-type n-type field-effect transistor, and a transistor 107 is an enhancement-type n-type field-effect transistor.

In the field-effect transistor, a drain current id is represented by the following equation (a) in a saturated state.

$$id = K \times (Vgs - Vth)^2 \quad (a)$$

In the equation (a), K indicates a conductivity coefficient, and Vgs indicates a gate—source voltage.

Since a same current flows through the transistor 105 and the transistor 107, a voltage Vgs7 of a node 108 can be represented by the following equation (b).

$$Vgs7 = Vth7 - (K5/K7)^{1/2} \times Vth5 \quad (b)$$

In the equation (b), K5 indicates a conductivity coefficient of the transistor 105, K7 indicates a conductivity coefficient of the transistor 107, Vth5 indicates a threshold voltage of the transistor 105, and Vth7 indicates a threshold voltage of the transistor 107.

When the transistors 105 and 107 are formed such that the conductivity coefficients K5 and K7 are the same, the equation (b) is changed to the following equation (c).

$$Vgs7 = Vth7 - Vth5 \quad (c)$$

Accordingly, the voltage Vgs7 at the node 108 becomes the difference between the threshold voltages of the transistors 105 and 107, wherein the difference is the reference voltage Vref. FIG. 2 shows the situation.

On the other hand, FIG. 3 shows another conventional reference voltage generation circuit in which a constant current flows through each of a transistor having a n-type gate and a transistor having a p-type gate so as to extract a difference between threshold voltages of the transistors as a reference voltage Vref (refer to Japanese Laid-Open Patent Application No. 54-132753, for example).

In FIG. 3, the transistor T1 having the n-type gate and the transistor T2 having the p-type gate have almost the same conductivity coefficient K. By passing a constant current Io through each of the transistor T1 and the transistor T2, the constant voltage Io can be represented by the following equation (d).

$$Io = K \times (V1 - Vth1)^2 = K \times (V2 - Vth2)^2 \quad (d)$$

In the equation (d), V1 indicates a drain-source voltage of the transistor T1, Vth1 indicates a threshold voltage of the transistor T1, V2 indicates a drain-source voltage of the transistor T2, Vth2 indicates a threshold voltage of the transistor T2.

Based on the equation (d), a following equation holds true.

$$V2 - V1 = Vth2 - Vth1$$

Therefore, by extracting the difference between drain voltages of the transistors T1 and T2, the difference between threshold voltages of the transistors T1 and T2 can be obtained.

FIG. 4 shows a circuit for obtaining a voltage difference between drains (refer to Japanese Laid-Open Patent Application No. 54-132753, for example). In the circuit shown in FIG. 4, instead of using the two kinds of transistors of the depletion-type and the enhancement-type, the threshold voltages of the transistors T1 and T2 are differentiated by changing the composition of gate electrodes of the transistors.

However, the circuit shown in FIG. 3 has the following three problems.

(First Problem)

Since the two kinds of the transistors of the depletion-type and the enhancement-type are used, the threshold voltage Vth of each transistor fluctuates independently due to process fluctuation, so that initial accuracy of the reference voltage Vref becomes worse. As shown in FIG. 5, assuming that variations of threshold voltage Vth of the transistors are $\Delta Vth5$ and $\Delta Vth7$ respectively, the reference voltage Vref may fluctuate between—$(\Delta Vth5 + \Delta Vth7)$ and $(\Delta Vth5 + \Delta Vth7)$. For example, when Vth5=−0.5V, Vth7=0.5V, and $\Delta Vth5 = \Delta Vth7 = 0.15V$, the reference voltage Vref may vary between 0.7V and 1.3V(+30%). Thus, there is a problem in that variation of the reference voltage Vref is large.

(Second Problem)

Since the two kinds of the transistors of the depletion-type and the enhancement-type are used, temperature characteristic of potential difference in channel areas of the transistors are not the same. Therefore, the temperature characteristic becomes worse. Even though a ratio (S5/S7) between a ratio S5 and a ratio S7 is adjusted wherein the ratio S5 is a ratio W/L between a channel width W and a channel length L of the transistor 105, and the ratio S7 is a ratio W/L between a channel width W and a channel length L of the transistor 107, the temperature characteristic becomes 300 ppm/° C. at most. Accordingly, there is a problem in that the temperature characteristic of the reference voltage Vref is large.

(Third Problem)

The source-drain voltages Vds5 and Vds7 of the transistors 105 and 107 are represented as follows.

$$Vds5 = VCC - Vg7$$

$$Vds7 = Vg7$$

Therefore, when the power source voltage VCC fluctuates, the source-drain voltage Vds5 of the transistor 105 also fluctuates, so that the reference voltage Vref fluctuates according to the fluctuation of the power source voltage VCC. As shown in FIG. 6, there is a problem in that, as the power source voltage VCC increases, a curve representing the relationship between the gate-source voltage Vgs and the drain current id of the transistor 105 shifts so that the reference voltage Vref increases by $\Delta Vref$.

On the other hand, the circuit shown in FIG. 4 can solve the first and second problems. But, since the circuit uses a resistance as a constant current source, the third problem cannot be solved.

SUMMARY

In an aspect of this disclosure, there is provided a reference voltage generation circuit and a constant voltage circuit using the reference voltage generation circuit for reducing variations in the reference voltage due to process fluctuation, temperature fluctuation and power source fluctuation.

In another aspect of this disclosure, there is provided a reference voltage generation circuit for outputting a predetermined reference voltage, including:

a first field-effect transistor that is an n channel-type field-effect transistor of a depletion-type, wherein one terminal of the first field-effect transistor is connected to a predetermined power source voltage;

a second field-effect transistor including a concentrated n-type gate, wherein one terminal of the second field-effect transistor is connected to another terminal of the first field-effect transistor; and a third field-effect transistor including a concentrated p-type gate, wherein one terminal of the third field-effect transistor is connected to another terminal of the second field-effect transistor;

wherein a gate of the first field-effect transistor is connected to a part where the first field-effect transistor and the second field-effect transistor are connected, each substrate gate of the first field-effect transistor and the third field-effect transistor is connected to a ground voltage, a gate and a substrate gate of the second field-effect transistor and a gate of the third field-effect transistor are connected to a connecting part where the second field-effect transistor and the third field-effect transistor are connected, and the reference voltage is output from the connecting part.

In the reference voltage generation circuit, a ratio S3 between a channel width and a channel length of the third field-effect transistor may be less than a ratio S2 between a channel width and a channel length of the second field-effect transistor. More particularly, a ratio S3/S2 between the ratio S3 and the ratio S2 may be between 0.5 and 0.67. More particularly, the ratio S3/S2 may be between 0.54 and 0.58.

In another aspect of this disclosure, there is provided a reference voltage generation circuit for outputting a predetermined reference voltage, including:

a first field-effect transistor that is an n channel-type field-effect transistor of a depletion-type, wherein one terminal of the first field-effect transistor is connected to a predetermined power source voltage;

a second field-effect transistor including a concentrated n-type gate, wherein one terminal of the second field-effect transistor is connected to another terminal of the first field-effect transistor; and a third field-effect transistor including a concentrated p-type gate, wherein one terminal of the third field-effect transistor is connected to another terminal of the second field-effect transistor;

wherein a gate of the first field-effect transistor is connected to a part where the first field-effect transistor and the second field-effect transistor are connected, each substrate gate of the first, second and third field-effect transistors is connected to a ground voltage, each gate of the second field-effect transistor and the third field-effect transistor is connected to a connecting part where the second field-effect transistor and the third field-effect transistor are connected, and the reference voltage is output from the connecting part.

In the reference voltage generation circuit, a ratio S3 between a channel width and a channel length of the third field-effect transistor may less than a ratio S2 between a channel width and a channel length of the second field-effect transistor. More particularly, a ratio S3/S2 between the ratio S3 and the ratio S2 may be between 0.35 and 0.45. More particularly, the ratio S3/S2 may be between 0.37 and 0.41.

In another aspect of this disclosure, there is provided a constant voltage circuit for generating a predetermined constant voltage from an input voltage based on a predetermined reference voltage generated by a reference voltage generation circuit, and outputting the constant voltage, the reference voltage generation circuit including:

a first field-effect transistor that is an n channel-type field-effect transistor of a depletion-type, wherein one terminal of the first field-effect transistor is connected to a predetermined power source voltage;

a second field-effect transistor including a concentrated n-type gate, wherein one terminal of the second field-effect transistor is connected to another terminal of the first field-effect transistor; and a third field-effect transistor including a concentrated p-type gate, wherein one terminal of the third field-effect transistor is connected to another terminal of the second field-effect transistor;

wherein a gate of the first field-effect transistor is connected to a part where the first field-effect transistor and the second field-effect transistor are connected, each substrate gate of the first field-effect transistor and the third field-effect transistor is connected to a ground voltage, a gate and a substrate gate of the second field-effect transistor and a gate of the third field-effect transistor are connected to a connecting part where the second field-effect transistor and the third field-effect transistor are connected, and the reference voltage is output from the connecting part.

In another aspect of this disclosure, there is provided a constant voltage circuit for generating a predetermined constant voltage from an input voltage based on a predetermined reference voltage generated by a reference voltage generation circuit, and outputting the constant voltage, the reference voltage generation circuit including:

a first field-effect transistor that is an n channel-type field-effect transistor of a depletion-type, wherein one terminal of the first field-effect transistor is connected to a predetermined power source voltage;

a second field-effect transistor including a concentrated n-type gate, wherein one terminal of the second field-effect transistor is connected to another terminal of the first field-effect transistor; and a third field-effect transistor including a concentrated p-type gate, wherein one terminal of the third field-effect transistor is connected to another terminal of the second field-effect transistor;

wherein a gate of the first field-effect transistor is connected to a part where the first field-effect transistor and the second field-effect transistor are connected, each substrate gate of the first, second and third field-effect transistors is connected to a ground voltage, each gate of the second field-effect transistor and the third field-effect transistor is connected to a connecting part where the second field-effect transistor and the third field-effect transistor are connected, and the reference voltage is output from the connecting part.

Regarding the above-mentioned reference voltage generation circuit and the above-mentioned constant voltage circuit using the reference voltage generation circuit initial accuracy of the reference voltage generated by the reference voltage generation circuit is improved from ±30% to ±6%. The temperature characteristic is improved from 300 ppm/° C. to 40 ppm/° C. In addition, fluctuation of the reference voltage Vref against power source voltage fluctuation is decreased to no more than $\frac{1}{10}$. Thus, variations of the reference voltage due to process fluctuation, temperature fluctuation and power source fluctuation can be reduced. In addition, as to the constant voltage circuit, fluctuation of the output voltage can be reduced.

BRIEF DESCRIPTION OF THE DRAWINGS

Other aspects, features and advantages will become more apparent from the following detailed description when read in conjunction with the accompanying drawings, in which.

DETAILED DESCRIPTION OF THE PREFERRED EMBODIMENTS

In the following, embodiments of the present invention are described with reference to figures.

First Embodiment

Figure 7:
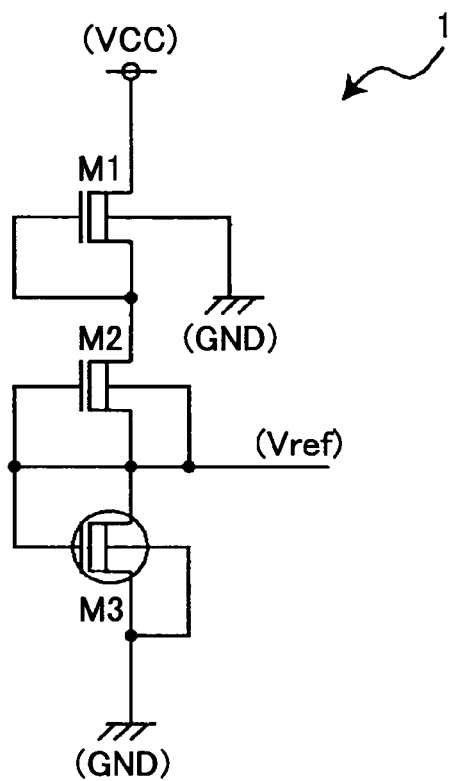
FIG. 7 is a circuit diagram showing an example of a reference voltage generation circuit in the first embodiment of the present invention.

FIG. 7 shows an example of a reference voltage generation circuit in the first embodiment of the present invention.

In FIG. 7, the reference voltage generation circuit 1 includes a n channel-type field-effect transistors M1-M3 which are serially connected between a power source voltage VCC and a ground voltage GND. The field-effect transistor M1 corresponds to a first field-effect transistor, the field-effect transistor M2 corresponds to a second field-effect transistor, and the field-effect transistor M3 corresponds to a third field-effect transistor.

The field-effect transistor M1 is a depletion-type transistor that is formed in a p well of a n-type substrate. In the field-effect transistor M1, a gate and a source are connected, and a substrate gate is connected to the ground voltage GND. As to the field-effect transistors M2 and M3, impurity densities of substrates and channel dope are the same. Each of the field-effect transistors M2 and M3 is formed in a p well of a n-type substrate, and the field-effect transistor M2 has a concentrated n-type gate, and the field-effect transistor M3 has a concentrated p-type gate. Each gate of the field-effect transistors M2 and M3 and the substrate gate of the field-effect transistor M2 are connected to a connection part between the field-effect transistors M2 and M3. The connection part forms an output terminal that outputs the reference voltage Vref, and the field-effect transistor M2 forms the constant current source. In addition, the substrate gate of the field-effect transistor M3 is connected to the ground voltage.

In the above-mentioned structure, the reference voltage Vref is represented by the following equation (1).

$$Vref = VthM3 - (KM2/KM3)^{1/2} \times VthM2 \quad (1)$$

In the equation (1), KM2 indicates a conductivity coefficient of the field-effect transistor M2, KM3 indicates a conductivity coefficient of the field-effect transistor M3, VthM2 indicates a threshold voltage of the field-effect transistor M2, and VthM3 indicates a threshold voltage of the field-effect transistor M3.

When field-effect transistors M2 and M3 are formed such that the conductivity coefficients are the same, the equation (1) can be rewritten as the following equation (2).

$$Vref = VthM3 - VthM2 \quad (2)$$

As shown in the equation (2), the reference voltage Vref is a difference between the threshold voltages of the field-effect transistors M2 and M3.

Figure 8:
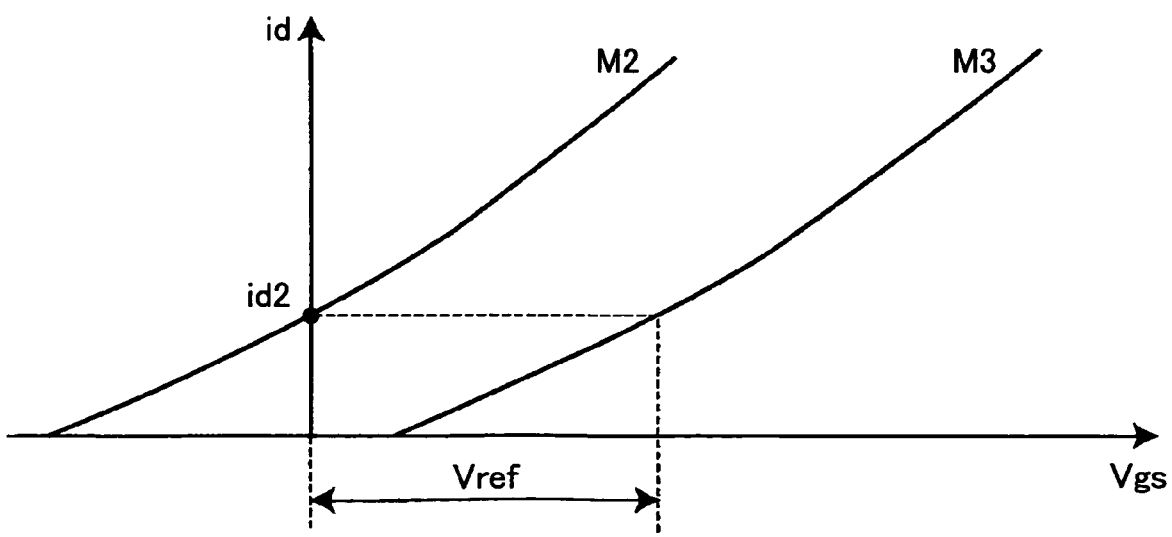
FIG. 8 shows Vgs-id characteristic for each of field-effect transistors M2 and M3.

FIG. 8 shows Vgs-id characteristics that are relationships between the gate-source voltage Vgs and the drain current id for the field-effect transistors M2 and M3.

As shown in FIG. 8, since the source and the gate are connected in the field-effect transistor M2, the drain current id2 flows. Since the field-effect transistor M3 is serially connected to the field-effect transistor M2, the current of id2 also flows through the field-effect transistor M3, so that the voltage difference between the gate-source voltages (Vgs) of the field-effect transistors M2 and M3 is the reference voltage Vref.

Figure 9:
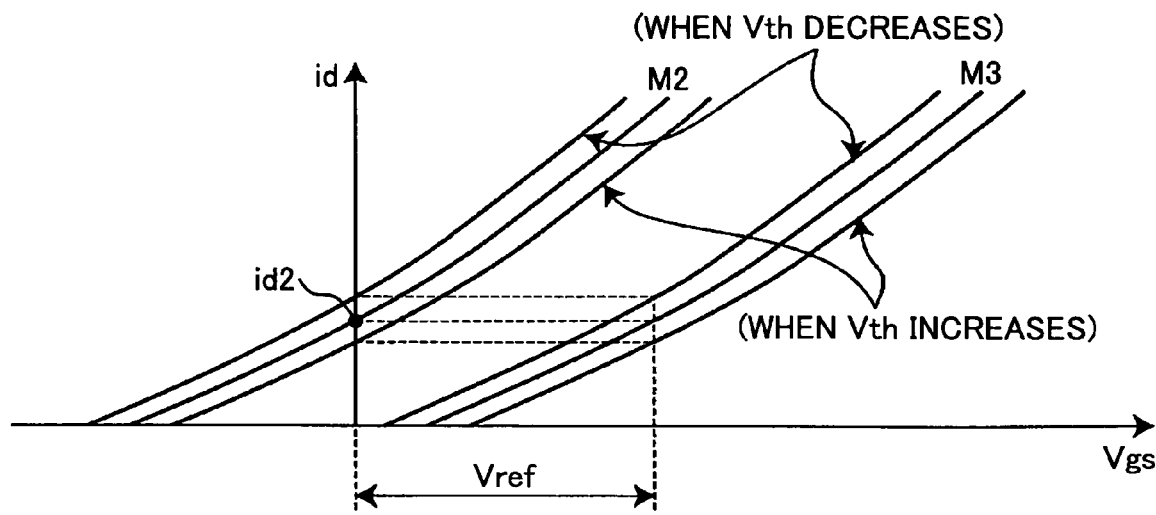
FIG. 9 shows variations of Vgs-id characteristic for each of field-effect transistors M2 and M3 due to process fluctuation.

Even though impurity density of the substrate or the channel dope fluctuates due to process fluctuation, each density of the field-effect transistors M2 and M3 fluctuates in the same way. Therefore, as shown in FIG. 9, the Vgs-id characteristics of the field-effect transistors M2 and M3 only shift from side to side while maintaining the relationship shown in FIG. 8, so that the absolute value of the reference voltage Vref is not affected and a stable reference voltage Vref can be generated. In addition, according to an experiment result, the fluctuation of the reference voltage Vref fell within about ±1% so that fluctuation of the reference voltage Vref were reduced.

The field-effect transistors M2 and M3 are the depletion-type transistors in which the impurity densities of the substrate or the channel dope are the same, and the field-effect transistor M2 has the concentrated n-type gate and the field-effect transistor M3 has the concentrated p-type gate. Even though the field-effect transistors M2 are M3 are configured such that the temperature characteristics of the potential difference in the channel area are the same, in other words, even though the field-effect transistors M2 are M3 are configured such that the conductivity coefficients in the equation (1) are the same, an obtained reference voltage Vref includes about −500 ppm/° C. as the temperature characteristic due to temperature characteristic of work function difference of the gates.

Figure 1:
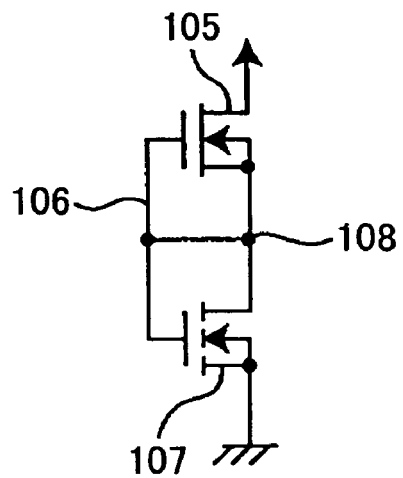
FIG. 1 is a circuit diagram showing an example of a conventional reference voltage generation circuit.
Figure 2:
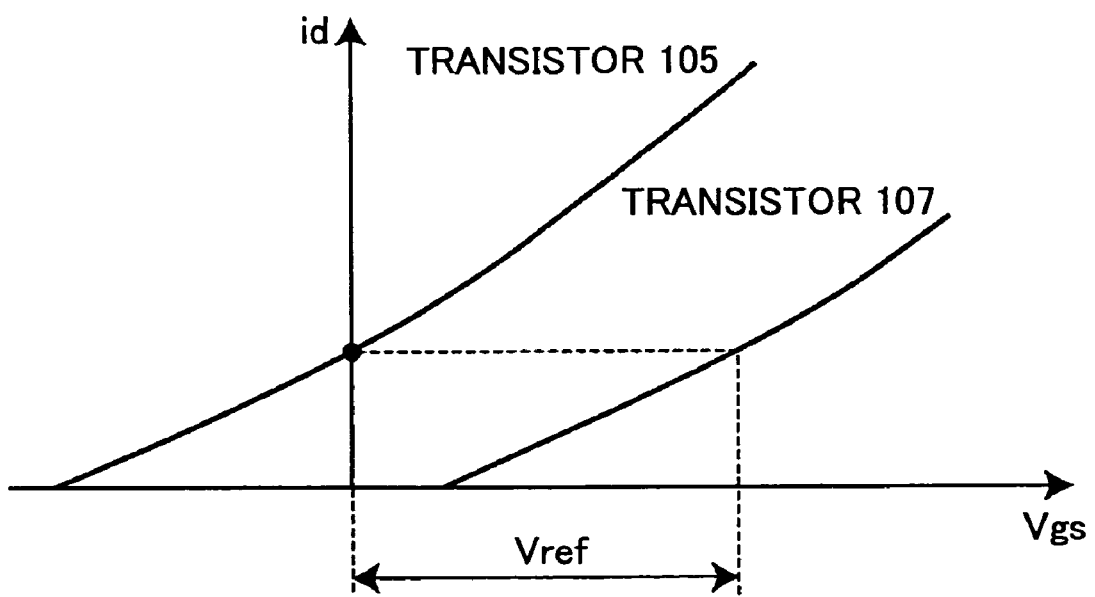
FIG. 2 shows Vgs-id characteristic for each of field-effect transistors 105 and 107 shown in FIG. 1.
Figure 3:
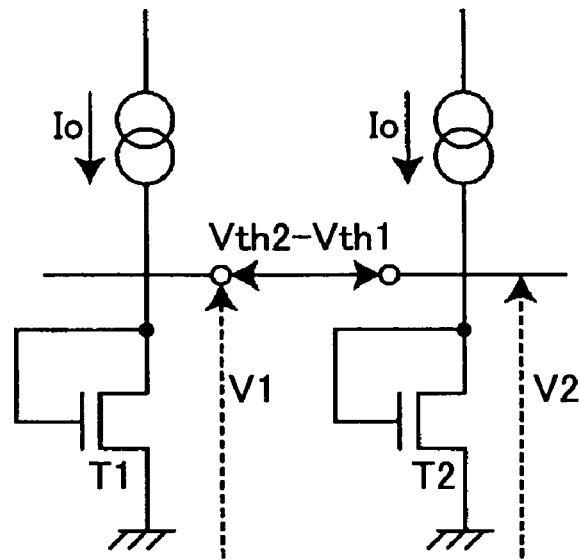
FIG. 3 is a circuit diagram showing another example of a conventional reference voltage generation circuit.
Figure 4:
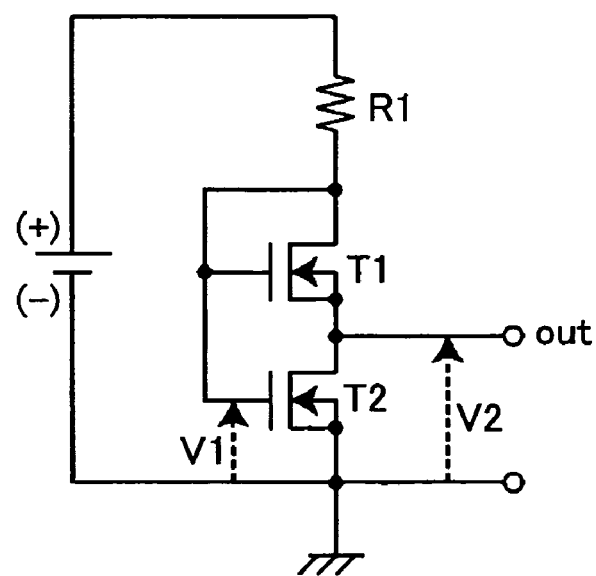
FIG. 4 is a circuit diagram showing another example of a conventional reference voltage generation circuit.
Figure 5:
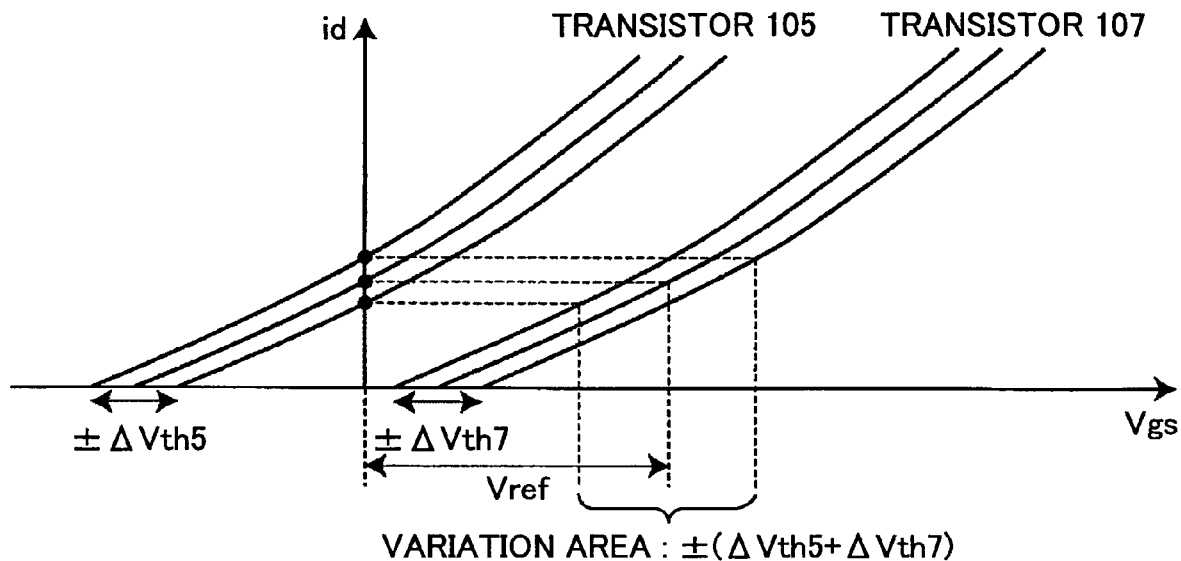
FIG. 5 shows variations of Vgs-id characteristic for each of field-effect transistors 105 and 107 shown in FIG. 1 due to process fluctuation.
Figure 6:
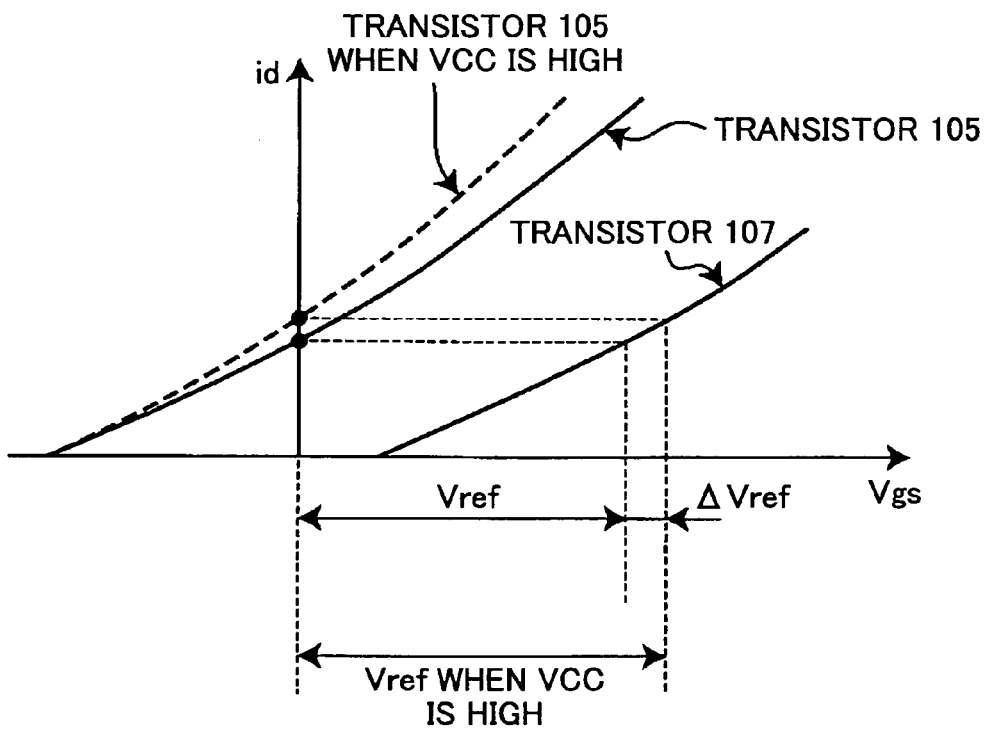
FIG. 6 shows variation of Vgs-id characteristic of the field-effect transistor 105 shown in FIG. 1.

However, the temperature characteristic is smaller than that of the conventional circuit shown in FIG. 1 in which two kinds of field-effect transistors of the depletion-type and the enhancement-type are used wherein there is no temperature characteristic of the work function difference of the gates but temperature characteristics of potential difference of the channel area are not the same between the field-effect transistors M2 and M3.

Thus, the temperature characteristic of the reference voltage Vref is further improved by adjusting each of a ratio S2(=W2/L2) between a channel width W2 and a channel length L2 of the field-effect transistor M2 and a ratio S3(=W3/L3) between a channel width W3 and a channel length L3 of the field-effect transistor M3.

Figure 10:
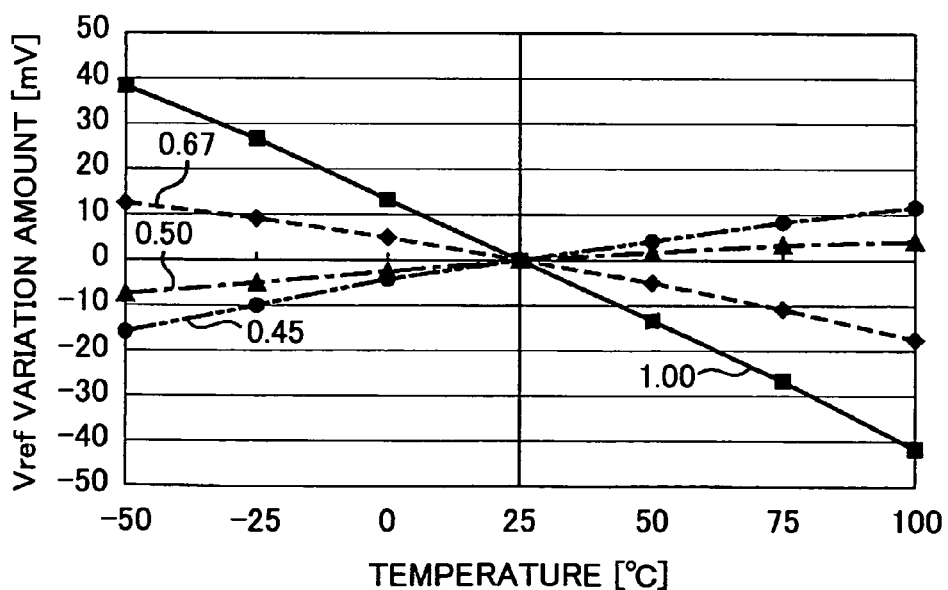
FIG. 10 shows experiment data of temperature characteristic of the reference voltage Vref when ratio S3/S2 is changed.

FIG. 10 shows experiment data of the temperature characteristic of the reference voltage Vref when the ratio S3/S2 is changed. FIG. 10 shows experiment data when 25° C. is set to be the center temperature.

In FIG. 10, the solid line indicates a case when S3/S2=1.00. In this case, the temperature characteristic of the reference voltage Vref is a minus value that is −545 ppm/° C. The dashed line in FIG. 10 indicates a case when S3/S2=0.67. In this case, the temperature characteristic of the reference voltage Vref is also a minus value that is −191 ppm/° C.

The alternate long and short dash line in FIG. 10 indicates a case when S3/S2=0.50. In this case, the temperature characteristic of the reference voltage Vref is a plus value that is 60 ppm/° C. The alternate long and two short dashes line in FIG. 10 indicates a case when S3/S2=0.45. In this case, the temperature characteristic of the reference voltage Vref is also a plus value that is 154 ppm/° C. That is, it can be found that, when S3/S2 is a value between 0.5 and 0.67, the smallest temperature characteristic of the reference voltage Vref can be obtained. The value of S3/S2 corresponding to the smallest temperature characteristic can be estimated to be a value between 0.54 and 0.58, and the temperature characteristic of the reference voltage Vref in this case is found to be about 40 ppm/° C. Accordingly, by adjusting the value of S3/S2, the temperature characteristic of the reference voltage Vref can be reduced. However, in this case, since the conductivity coefficient of the equation (1) remains, fluctuation of the reference voltage Vref increases to about ±5~6%. But, the fluctuation is smaller than that of the conventional technology.

Figure 11:
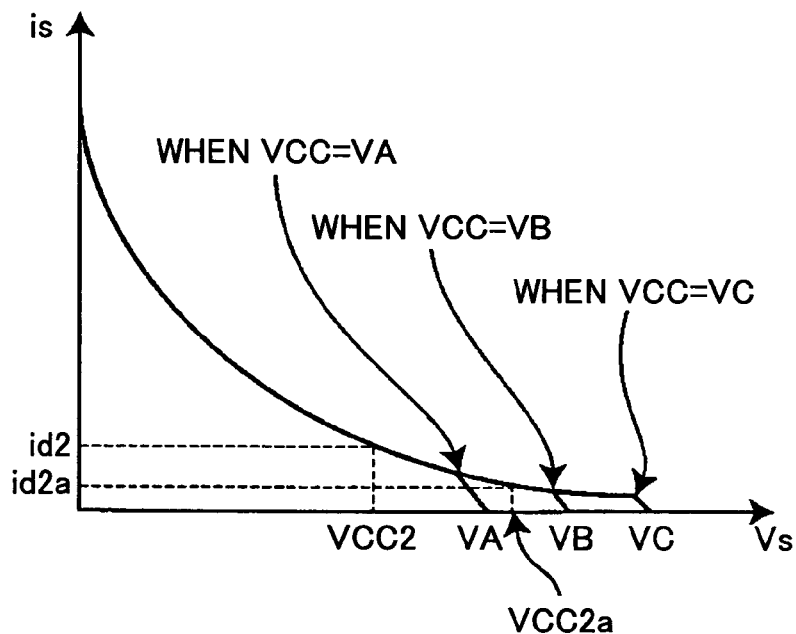
FIG. 11 shows an example of Vs-is characteristic of the field-effect transistor M1.

FIG. 11 shows an example of Vs-is characteristic that is a relationship between the source voltage Vs and the source current "is" of the field-effect transistor M1.

In FIG. 11, the power source voltage VCC is changed in which VA, VB and VC are used. For each of the three cases, FIG. 11 shows a source current "is" that flows when the source voltage Vs increases in the field-effect transistor M1. For example, when the source power voltage VCC is VA, as the source voltage Vs approaches VA, the source current rapidly decreases, and the source current "is" becomes 0 when Vs=VA. As shown in FIG. 8, the drain current of id2 flows through the field-effect transistor M2 that forms the constant current source, and also the same current of id2 flows through the field-effect transistor M1 that is located on the same current path.

Therefore, the source voltage Vs of the field-effect transistor M1 is fixed to VCC2 irrespective of the power source voltage VCC. However, when id2 is very small, that is, when id2 is id2a, for example, the source voltage Vs of the field-effect transistor M1 is VCC2a. Thus, when VCC=VB or VCC=VC, VCC2a<VB or VCC2a<VC holds true, and the source voltage Vs of the field-effect transistor M1 is fixed to VCC2a. However, when VCC=VA, since VCC2a>VA holds true, the source voltages Vs of the field-effect transistor M1 is VA at most. Therefore, it is necessary to properly set the current id2 or VCC2 according to a minimum operation voltage of the circuit. Such setting can be easily performed by adjusting gate width W/gate length L of the field-effect transistor M1.

As described above, by providing the field-effect transistor M1, the source-drain voltages VdsM2 and VdsM3 of the field-effect transistors M2 and M3 are represented as follows.

$$VdsM2 = VCC2 - Vref$$

$$VdsM3 = Vref$$

Therefore, even though the power source voltage VCC fluctuates, the source-drain voltage of each of the field-effect transistors M2 and M3 is not affected so that the fluctuation of the reference voltage Vref does not occur.

Figure 12:
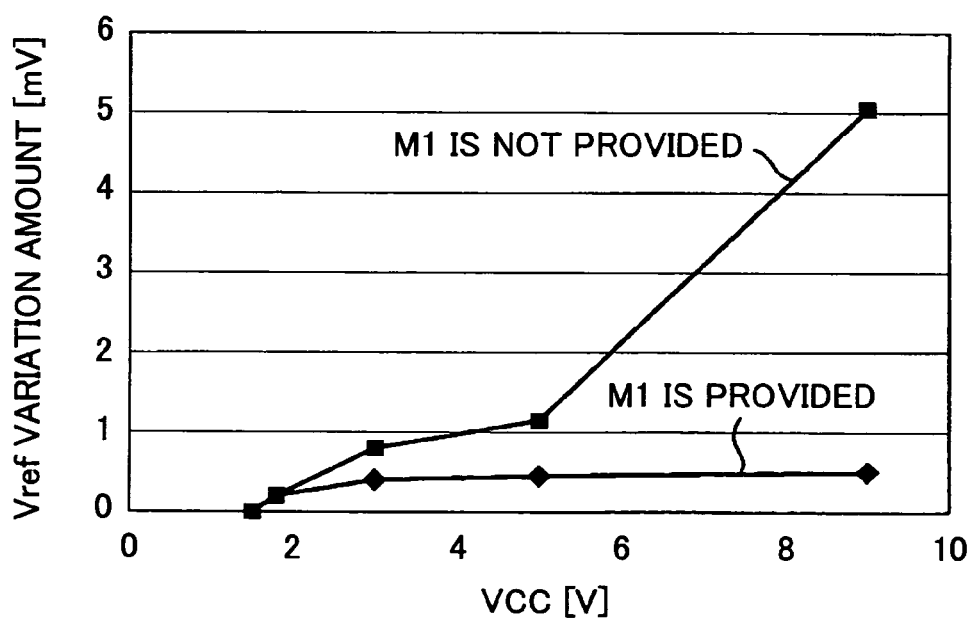
FIG. 12 shows experiment data of power source voltage dependence of the reference voltage Vref in two cases where there is the field-effect transistor M1 and where there is not the field-effect transistor M1.

FIG. 12 shows experiment data of power source voltage dependence of the reference voltage Vref in two cases where there is the field-effect transistor M1 and where there is not the field-effect transistor M1.

As shown in FIG. 12, the voltage fluctuation of the reference voltage Vref when the field-effect transistor M1 is provided is 0.4 mv that is no more than 1/10 of the voltage fluctuation when the field-effect transistor M1 is not provided. Accordingly, by providing the field-effect transistor M1, fluctuation of the reference voltage Vref against the fluctuation of the power source voltage VCC can be reduced.

Figure 13:
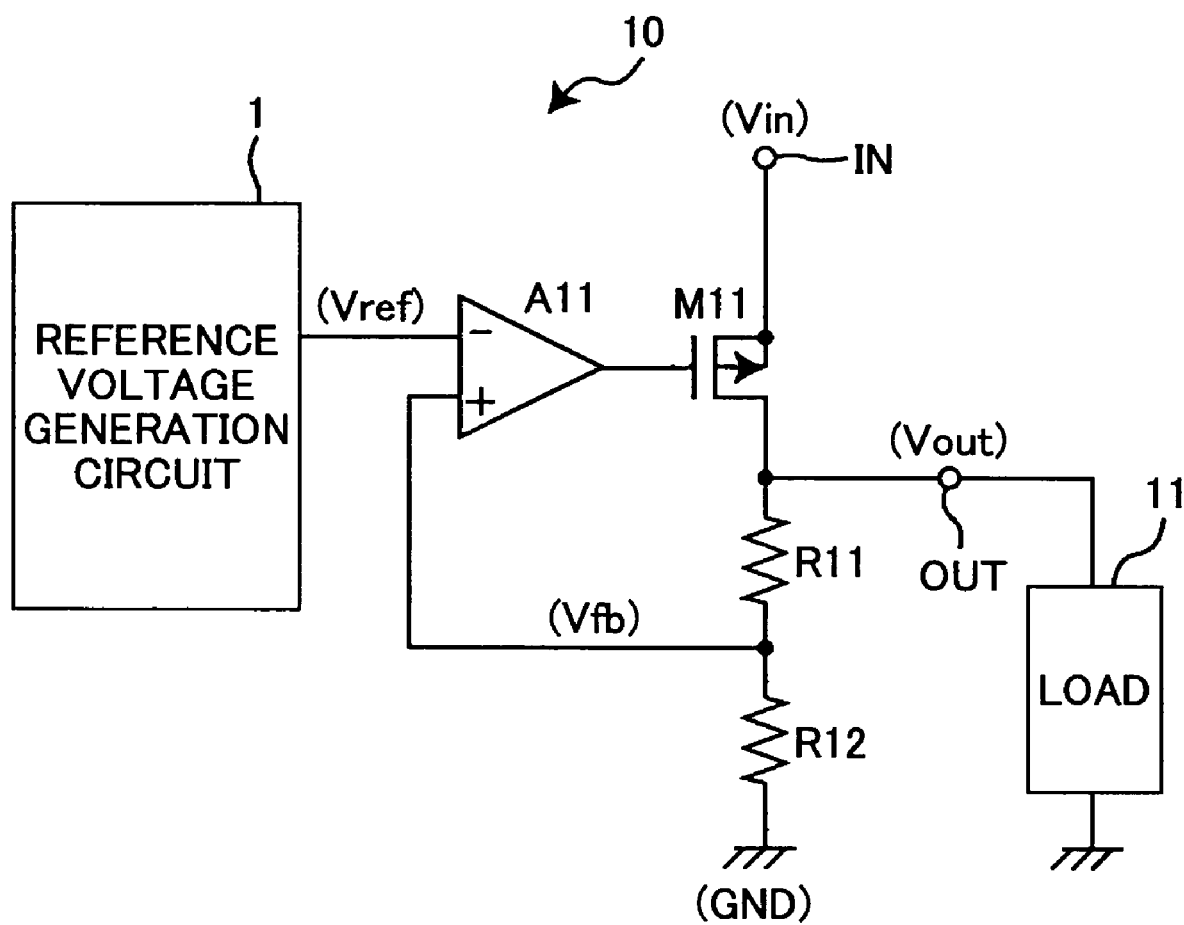
FIG. 13 shows an example of a constant voltage circuit using the reference voltage generation circuit 1 shown in FIG. 7.

FIG. 13 shows an example of a constant voltage circuit using the reference voltage generation circuit 1. In FIG. 13, a series regulator is shown as an example of the constant voltage circuit.

In FIG. 13, the series regulator 10 includes the reference voltage generation circuit 1 for generating and outputting a predetermined reference voltage Vref, an error amplifying circuit A11, an output transistor M11 including a PMOS transistor and resistances R11 and R12 for detecting an output voltage.

In the circuit shown in FIG. 13, the output transistor M11 is connected to a part between an input terminal IN and an output terminal OUT, and the resistances R11 and R12 are serially connected between the output terminal OUT and the ground voltage GND. The resistances R11 and R12 divide the output voltage Vout to generate a divided voltage Vfb and output the divided voltage Vfb to a non-inverting input terminal of the error amplifying circuit A11. The reference voltage Vref is input to an inverting input terminal of the error amplifying circuit A11, and the error amplifying circuit A11 controls operation of the output transistor M11 such that the divided voltage Vfb becomes the reference voltage Vref. In addition, a load 11 is connected to a part between the output terminal OUT and the ground voltage GND.

Figure 14:
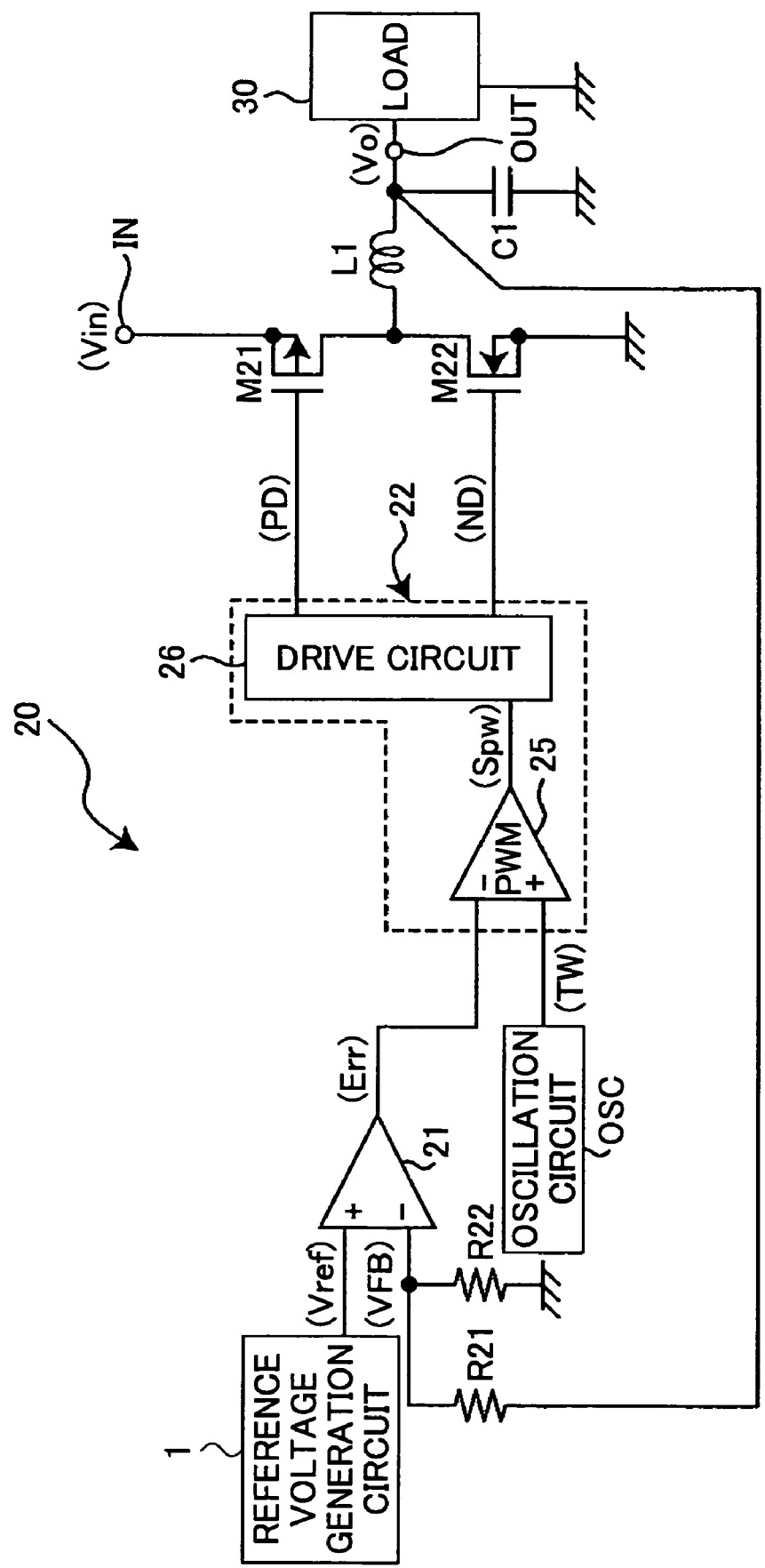
FIG. 14 shows another example of a constant voltage circuit using the reference voltage generation circuit 1 shown in FIG. 7.

FIG. 14 shows another example of a constant voltage circuit using the reference voltage generation circuit 1. In FIG. 14, a switching regulator is shown as the constant voltage circuit as an example.

As shown in FIG. 14, the switching regulator 20 includes a first switching element M21, a switching element M22, an inductor L1 and a condenser C1, and resistances R21 and R22. The first switching element M21 performs switching operation for performing output control of the input voltage Vin. The switching element M22 includes an NMOS transistor and is for synchronous rectification. The inductor L1 and the condenser C1 form a smoothing circuit. The resistances R21 and R22 are for detecting output voltage and divide the output voltage Vo to generate a divided voltage VFB and output it.

In addition, the switching regulator 20 includes the reference voltage generation circuit 1, an error amplifying circuit 21, a PWM control circuit 22, and an oscillation circuit OSC. The reference voltage generation circuit 1 generates a predetermined reference voltage Vref and outputs it. The error amplifying circuit 21 compares between the divided voltage VFB and the reference voltage Vref so as to output an output signal Err which is a voltage according to the comparing result. The PWM control circuit 22 performs PWM control on the first switching element M21 and the switching element M22 for synchronous rectification according to the output signal Err of the error amplifying circuit 21 so as to perform switching control for the first switching element M21 and the switching element M22 for synchronous rectification. The oscillation circuit OSC generates a triangular wave signal TW having a predetermined frequency and outputs the signal TW to the PWM control circuit 22.

The PWM control circuit includes a PWM circuit 25 and a drive circuit 26. The PWM circuit 25 generates a pulse signal Spw for performing PWM control from the output signal Err of the error amplifying circuit 21 and the triangular wave signal TW of the oscillation circuit OSC, and outputs the pulse signal Spw. According to the pulse signal Spw from the PWM circuit 25, the drive circuit 26 generates a control signal PD for performing switching control for the first switching element M21 and a control signal ND for performing switching control of the switching element M22 for synchronous rectification.

A load is connected between the output terminal OUT and the ground voltage. The first switching element M21 and the inductor L1 are serially connected between the input terminal IN and the output terminal OUT. In addition, the switching element M22 for synchronous rectification is connected between the ground voltage and a connection part between the first switching element M21 and the inductor L1, and a condenser C1 is connected to a part between the output terminal OUT and the ground voltage. The serially connected resistances R21 and R22 are connected to a part between the output terminal OUT and the ground voltage.

A part at which the resistances R21 and R22 are connected is connected to an inverting input terminal of the error amplifying circuit 21, and the reference voltage Vref is connected to a non-inverting input terminal of the error amplifying circuit 21. The output signal Err of the error amplifying circuit 21 is output to an inverting input terminal of a comparator that forms the PWM circuit 25. The triangular wave signal TW from the oscillation circuit OSC is output to a non-inverting input terminal of a comparator that forms the PWM circuit 11. The pulse signal Spw from the PWM circuit 25 is output to the drive circuit 26. The drive circuit 26 outputs the control signal PD to the gate of the first switching element 21 for performing switching control for the first switching element 21. The drive circuit 26 also outputs the control signal ND to a gate of the switching element M22 for synchronous rectification for performing switching control of the switching element M22.

In this configuration, the switching regulator 20 operates as a synchronous rectification switching regulator, and the first switching element M21 performs switching operation. When the first switching element M21 is turned on, a current is supplied to the inductor L1, and the switching element M22 for synchronous rectification is off at this time. When the first switching element M21 is turned off, the switching element M22 for synchronous rectification is turned on, so that energy stored in the inductor L1 is released though the switching element M22. A current generated at this time is smoothed in the condenser C1 and is output to the load 30 from the output terminal OUT.

The output voltage Vo output from the output terminal OUT is divided by the resistances R21 and R22 for output voltage detection, and the divided voltage VFB is input to an inverting input terminal of the error amplifying circuit 21. Since the reference voltage Vref is input to the non-inverting input terminal of the error amplifying circuit 21, a voltage difference between the divided voltage VFB and the reference voltage Vref is amplified by the error amplifying circuit 21, and the amplified voltage is output to the inverting input terminal of the PWM circuit 25. The triangular wave signal TW from the oscillation circuit OSC is input to the non-inverting input terminal of the PWM circuit 25, so that the PWM circuit 25 outputs the PWM controlled pulse signal Spw to the drive circuit 26.

As the output voltage Vo of the switching regulator increases, the voltage of the output signal Err of the error amplifying circuit 21 decreases, so that duty cycle of the pulse signal Spw of the PWM circuit 25 decreases. As a result, the time during which the first switching element M21 keeps on decrease, so that the output voltage Vo of the switching regulator 20 decreases. When the output voltage Vo of the switching regulator 20 decreases, inverse operation is performed such that the output voltage Vo of the switching regulator 20 is controlled to be constant.

As described above, according to the reference voltage generation circuit is improved with respect to the conventional circuit. As to initial accuracy, it is improved from ±30% to ±6%. The temperature characteristic is improved from 300 ppm/° C. to 40 ppm/° C. In addition, fluctuation of the reference voltage Vref against power source voltage fluctuation is decreased to no more than $1/10$.

Second Embodiment

In the first embodiment, the substrate gate of the field-effect transistor M2 is connected to the source of the field-effect transistor M2. But, the substrate gate of the field-effect transistor M2 can be connected to the ground voltage GND. This configuration is described as the second embodiment of the present invention.

Figure 15:
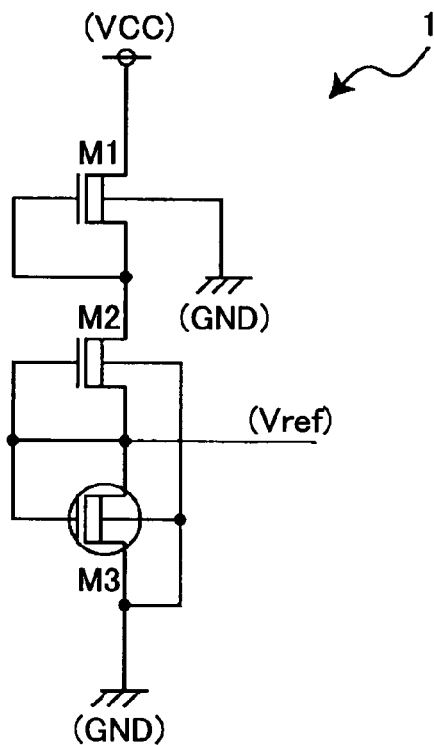
FIG. 15 is a circuit diagram showing an example of a reference voltage generation circuit in the second embodiment of the present invention.

FIG. 15 shows an example of a reference voltage generation circuit in the second embodiment of the present invention. In FIG. 15, the same features as those of FIG. 7 are indicated with the same reference signs. In the following, different points from FIG. 7 are mainly described.

In the circuit shown in FIG. 15, the different point compared to FIG. 15 is that the substrate gate of the field-effect transistor M2 is connected to the ground voltage GND.

In such configuration, in the same way as the circuit shown in FIG. 7, when impurity density of the substrate or channel dope fluctuates due to process fluctuation, each density of the field-effect transistors M2 and M3 fluctuates similarly. Therefore, as shown in FIG. 9, Vgs-id characteristics of the field-effect transistors M2 and M3 only shift from side to side while keeping the relationship of FIG. 8, so that the absolute value of the reference voltage Vref is not affected and the reference voltage Vref can be generated stably.

In addition, since substrate bias effect occurs in the field-effect transistor M2, potential difference of the channel area has a little temperature characteristic compared with the first embodiment. But, the temperature characteristic is smaller than that of the conventional technology.

Figure 16:
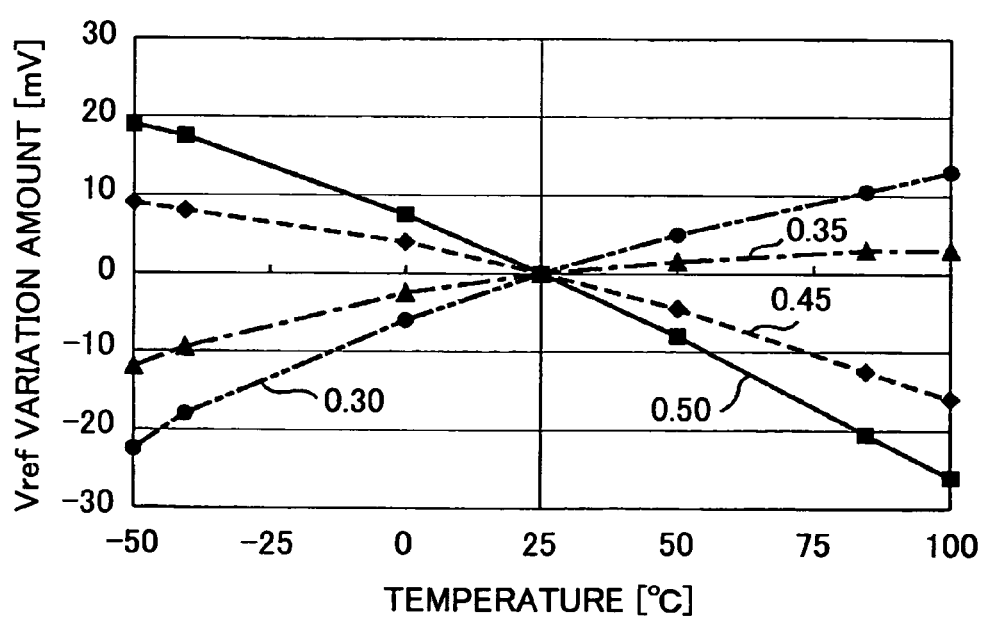
FIG. 16 shows experiment data of temperature characteristic of the reference voltage Vref when ratio S3/S2 is changed.

Thus, in the same way as the first embodiment, by adjusting the ratio S3/S2, the temperature characteristic of the reference voltage Vref can be decreased. FIG. 16 shows experiment data of the temperature characteristic. As shown in FIG. 16, it can be found that the temperature characteristic becomes minimum when the ratio S3/S2 is a value between 0.35 and 0.45. The value of S3/S2 corresponding to the smallest temperature characteristic can be estimated to be a value between 0.37 and 0.41, and the temperature characteristic of the reference voltage Vref in this case is found to be about 40 ppm/° C. Accordingly, by adjusting the value of S3/S2, the temperature characteristic of the reference voltage Vref can be reduced.

In addition, in the same way as the first embodiment, source-drain voltages VdsM2 and VdsM3 of the field-effect transistors M2 and M3 are represented as follows.

$$VdsM2 = VCC2 - Vref$$

$$VdsM3 = Vref$$

Therefore, even though the power source voltage VCC fluctuates, each of the source-drain voltages VdsM2 and VdsM3 of the field-effect transistors M2 and M3 is not affected so that the reference voltage Vref does not fluctuate.

As mentioned above, according to the reference voltage generation circuit of the second embodiment, the same effect as the first embodiment can be obtained. In addition to that, the reference voltage generation circuit of the second embodiment can be used when the substrate voltage of the field-effect transistor M2 is fixed to the ground voltage GND, that is, when the field-effect transistors M1-M3 are formed in a p-type substrate, for example. In addition, since each substrate voltage of the field-effect transistors M1-M3 is the ground voltage GND, it is not necessary to provide any space between field-effect transistors, so that the chip area can be reduced.

The first embodiment or the second embodiment can be selected according to noise characteristic and the like on a case-by-case basis. In addition, like the first embodiment, the reference voltage generation circuit of the second embodiment can be used as the constant voltage circuit shown in FIGS. 13 and 14.

The present invention is not limited to the specifically disclosed embodiments, and variations and modifications may be made without departing from the scope of the present invention.

The present application contains subject matter related to Japanese patent application No. 2005-252001, filed in the JPO on Aug. 31, 2005, the entire contents of which are incorporated herein by reference.

What is claimed is:

1. A reference voltage generation circuit for outputting a predetermined reference voltage, comprising:
   a first field-effect transistor that is an n channel-type field-effect transistor of a depletion-type, wherein one terminal of the first field-effect transistor is connected to a predetermined power source voltage;
   a second field-effect transistor including a concentrated n-type gate, wherein one terminal of the second field-effect transistor is connected to another terminal of the first field-effect transistor; and
   a third field-effect transistor including a concentrated p-type gate, wherein one terminal of the third field-effect transistor is connected to another terminal of the second field-effect transistor;
   wherein a gate of the first field-effect transistor is connected to a part where the first field-effect transistor and the second field-effect transistor are connected, each substrate gate of the first field-effect transistor and the third field-effect transistor is connected to a ground voltage, a gate and a substrate gate of the second field-effect transistor and a gate of the third field-effect transistor are connected to a connecting part where the second field-effect transistor and the third field-effect transistor are connected, and the reference voltage is output from the connecting part,
   wherein a ratio S3 between a channel width and a channel length of the third field-effect transistor is less than a ratio S2 between a channel width and a channel length of the second field-effect transistor.

2. The reference voltage generation circuit as claimed in claim 1, wherein the second field-effect transistor and the third field-effect transistor are depletion-type transistors.

3. The reference voltage generation circuit as claimed in claim 1, wherein each of the second field-effect transistor and the third field-effect transistor is formed such that a ratio S3/S2 between the ratio S3 and the ratio S2 is between 0.5 and 0.67.

4. The reference voltage generation circuit as claimed in claim 3, wherein each of the second field-effect transistor and the third field-effect transistor is formed such that the ratio S3/S2 between the ratio S3 and the ratio S2 is between 0.54 and 0.58.

5. A reference voltage generation circuit for outputting a predetermined reference voltage, comprising:
   a first field-effect transistor that is an n channel-type field-effect transistor of a depletion-type, wherein one terminal of the first field-effect transistor is connected to a predetermined power source voltage;
   a second field-effect transistor including a concentrated n-type gate, wherein one terminal of the second field-effect transistor is connected to another terminal of the first field-effect transistor; and
   a third field-effect transistor including a concentrated p-type gate, wherein one terminal of the third field-effect transistor is connected to another terminal of the second field-effect transistor;
   wherein a gate of the first field-effect transistor is connected to a part where the first field-effect transistor and the second field-effect transistor are connected, each substrate gate of the first, second and third field-effect transistors is connected to a ground voltage, each gate of the second field-effect transistor and the third field-effect transistor is connected to a connecting part where the second field-effect transistor and the third field-effect transistor are connected, and the reference voltage is output from the connecting part,
   wherein a ratio S3 between a channel width and a channel length of the third field-effect transistor is less than a ratio S2 between a channel width and a channel length of the second field-effect transistor.

6. The reference voltage generation circuit as claimed in claim 5, wherein each of the second field-effect transistor and the third field-effect transistor is formed such that a ratio S3/S2 between the ratio S3 and the ratio S2 is between 0.35 and 0.45.

7. The reference voltage generation circuit as claimed in claim 6, wherein each of the second field-effect transistor and the third field-effect transistor is formed such that a ratio S3/S2 between the ratio S3 and the ratio S2 is between 0.37 and 0.41.

8. A constant voltage circuit for generating a predetermined constant voltage from an input voltage based on a predetermined reference voltage generated by a reference voltage generation circuit, and outputting the constant voltage, the reference voltage generation circuit comprising:
   a first field-effect transistor that is an n channel-type field-effect transistor of a depletion-type, wherein one terminal of the first field-effect transistor is connected to a predetermined power source voltage;
   a second field-effect transistor including a concentrated n-type gate, wherein one terminal of the second field-effect transistor is connected to another terminal of the first field-effect transistor; and
   a third field-effect transistor including a concentrated p-type gate, wherein one terminal of the third field-effect transistor is connected to another terminal of the second field-effect transistor;
   wherein a gate of the first field-effect transistor is connected to a part where the first field-effect transistor and the second field-effect transistor are connected, each substrate gate of the first field-effect transistor and the third field-effect transistor is connected to a ground voltage, a gate and a substrate gate of the second field-effect transistor and a gate of the third field-effect transistor are connected to a connecting part where the second field-effect transistor and the third field-effect transistor are connected, and the reference voltage is output from the connecting part,
   wherein a ratio S3 between a channel width and a channel length of the third field-effect transistor is less than a ratio S2 between a channel width and a channel length of the second field-effect transistor.

9. The constant voltage circuit as claimed in claim 8, wherein each of the second field-effect transistor and the third field-effect transistor is formed such that a ratio S3/S2 between the ratio S3 and the ratio S2 is between 0.5 and 0.67.

10. The constant voltage circuit as claimed in claim 9, wherein each of the second field-effect transistor and the third field-effect transistor is formed such that the ratio S3/S2 between the ratio S3 and the ratio S2 is between 0.54 and 0.58.

11. A constant voltage circuit for generating a predetermined constant voltage front an input voltage based on a predetermined reference voltage generated by a reference voltage generation circuit, and outputting the constant voltage, the reference voltage generation circuit comprising:
   a first field-effect transistor that is an n channel-type field-effect transistor of a depletion-type, wherein one terminal of the first field-effect transistor is connected to a predetermined power source voltage;
   a second field-effect transistor including a concentrated n-type gate, wherein one terminal of the second field-effect transistor is connected to another terminal of the first field-effect transistor; and
   a third field-effect transistor including a concentrated p-type gate, wherein one terminal of the third field-effect transistor is connected to another terminal of the second field-effect transistor;
   wherein a gate of the first field-effect transistor is connected to a part where the first field-effect transistor and the second field-effect transistor are connected, each substrate gate of the first, second and third field-effect transistors is connected to a ground voltage, each gate of the second field-effect transistor and the third field-effect transistor is connected to a connecting part where the second field-effect transistor and the third field-effect transistor are connected, and the reference voltage is output from the connecting part,
   wherein a ratio S3 between a channel width and a channel length of the third field-effect transistor is less than a ratio S2 between a channel width and a channel length of the second field-effect transistor.

12. The constant voltage circuit as claimed in claim 11, wherein each of the second field-effect transistor and the third field-effect transistor is formed such that a ratio S3/S2 between the ratio S3 and the ratio S2 is between 0.35 and 0.45.

13. The constant voltage circuit as claimed in claim 12, wherein each of the second field-effect transistor and the third field-effect transistor is formed such that the ratio S3/S2 between the ratio S3 and the ratio S2 is between 0.37 and 0.41.

* * * * *